(12) United States Patent
Karni et al.

(10) Patent No.: US 10,644,061 B2
(45) Date of Patent: May 5, 2020

(54) PHOTODETECTOR-ARRAYS AND METHODS OF FABRICATION THEREOF

(71) Applicant: Semi Conductor Devices—an Elbit Systems-Rafael Partnership, Haifa (IL)

(72) Inventors: Yoram Karni, Qiryat Tivon (IL); Inna Lukomsky, Kiryat-Yam (IL); Eran Avnon, Lotem (IL)

(73) Assignee: Semi Conductor Devices—an Elbit Systems-Rafael Partnership, Haifa (IL)

( * ) Notice: Subject to any disclaimer, the term of this patent is extended or adjusted under 35 U.S.C. 154(b) by 350 days.

(21) Appl. No.: 15/366,016

(22) Filed: Dec. 1, 2016

(65) Prior Publication Data
US 2017/0162613 A1 Jun. 8, 2017

(30) Foreign Application Priority Data
Dec. 6, 2015 (IL) .......................................... 242952

(51) Int. Cl.
*H01L 27/146* (2006.01)
*H01L 23/00* (2006.01)
(Continued)

(52) U.S. Cl.
CPC ........ *H01L 27/1469* (2013.01); *H01L 23/544* (2013.01); *H01L 24/81* (2013.01);
(Continued)

(58) Field of Classification Search
CPC ........... H01L 27/1469; H01L 27/14634; H01L 27/14636; H01L 2225/06593;
(Continued)

(56) References Cited

U.S. PATENT DOCUMENTS

| 6,170,155 B1 * | 1/2001 | Marion | B81C 3/002 |
| | | | 228/179.1 |
| 6,550,665 B1 * | 4/2003 | Parrish | B23K 35/26 |
| | | | 228/180.21 |

(Continued)

FOREIGN PATENT DOCUMENTS

WO     WO 94/17557     8/1994

OTHER PUBLICATIONS

Davoine, C. et al., "Low Temperature Fluxless Technology for Ultra-fine Pitch and Large Devices flip-chip Bonding", Electronics Packaging Technology Conference (2005), pp. 639-645.
(Continued)

*Primary Examiner* — Phat X Cao
*Assistant Examiner* — Victor V Barzykin
(74) *Attorney, Agent, or Firm* — William S. Frommer; Haug Partners LLP

(57) ABSTRACT

A photodetector-array and fabrication method thereof are disclosed. The photodetector-array includes a first and second semiconductor structures having respective active regions defining respective pluralities of active photodetectors and active readout integrated circuit pixels (RICPs) electronically connectable to one another respectively. The first and second semiconductor structures are made with different semiconductor materials/compositions having different first and second coefficients of thermal expansion (CTEs) respectively. The pitch distances of the active photodetectors and the pitch distances of the respective active RICPs are configured in accordance with the difference between the first and second CTEs, such that at high temperatures, at which electrical coupling between the first and second semiconductor structures is performed, the electric contacts of the active photodetectors and of their respective RICPs overlap. Accordingly, after the first and second
(Continued)

semiconductor structures are bonded together, at least 99.5% of the active photodetector are electrically connected with their respective RICPs.

19 Claims, 8 Drawing Sheets

(51) Int. Cl.
    *H01L 25/00*     (2006.01)
    *H01L 23/544*     (2006.01)
    *H01L 25/065*     (2006.01)

(52) U.S. Cl.
    CPC ........ *H01L 25/50* (2013.01); *H01L 27/14634* (2013.01); *H01L 27/14636* (2013.01); *H01L 23/562* (2013.01); *H01L 24/06* (2013.01); *H01L 24/13* (2013.01); *H01L 24/14* (2013.01); *H01L 24/16* (2013.01); *H01L 25/0657* (2013.01); *H01L 2223/5442* (2013.01); *H01L 2223/54426* (2013.01); *H01L 2223/54473* (2013.01); *H01L 2224/06131* (2013.01); *H01L 2224/13109* (2013.01); *H01L 2224/14131* (2013.01); *H01L 2224/16105* (2013.01); *H01L 2224/16108* (2013.01); *H01L 2224/8113* (2013.01); *H01L 2224/81048* (2013.01); *H01L 2224/81122* (2013.01); *H01L 2224/81129* (2013.01); *H01L 2224/81132* (2013.01); *H01L 2224/81194* (2013.01); *H01L 2224/81815* (2013.01); *H01L 2224/81948* (2013.01); *H01L 2225/06513* (2013.01); *H01L 2225/06593* (2013.01); *H01L 2924/351* (2013.01); *H01L 2924/381* (2013.01)

(58) Field of Classification Search
    CPC . H01L 2223/54473; H01L 2223/54426; H01L 2223/5442; H01L 2225/06513; H01L 2224/16105; H01L 2224/13109; H01L 2224/81194; H01L 2224/16108; H01L 2224/06131; H01L 2924/381; H01L 25/0657; H01L 2924/351; H01L 2224/81815; H01L 2224/81132; H01L 2224/81948; H01L 2224/8113; H01L 2224/14131; H01L 2224/81129; H01L 2224/81122; H01L 2224/81048; H01L 24/14; H01L 24/13; H01L 24/06; H01L 2924/014

See application file for complete search history.

(56) References Cited

U.S. PATENT DOCUMENTS

| | | |
|---|---|---|
| 7,786,438 B1 | 8/2010 | De Vilbiss et al. |
| 8,674,523 B2 * | 3/2014 | Chen ................ H01L 22/32 257/797 |
| 2004/0121507 A1 | 6/2004 | Bude et al. |
| 2007/0045387 A1 * | 3/2007 | Marion ............ H01L 23/49811 228/180.22 |

OTHER PUBLICATIONS

Euorpean Search Report dated May 10, 2017.

* cited by examiner

Well bonded bumps

Disconnected bumps

200

210 → providing a first semiconductor structure 130 that is made according to a first semiconductor technology, and includes an arrangement of a plurality of light sensitive regions (pixels) 132 in an active light sensing region 134 thereof with certain predetermined spacings $d_{ij}$ between pairs {i,j} of the pixels 132.

220 → providing a second semiconductor structure 110 that is made according to a second semiconductor technology, and includes a plurality of RICPs 112 in an active readout region 114 thereof with certain predetermined spacings $e_{ij}$ between pairs {i,j} of the RICPs 112.

230 → The first and second semiconductor structures 130 and 110 are configured such that the spacings $d_{ij}$ between pairs {i,j} of pixels 132 in the active region 134 substantially match/equal the spacings $e_{ij}$ between corresponding pairs {i,j} of RICPs 112 in the active readout region 114 at a freezing temperature of an interconnecting material/composition used for bonding/jointing/electrically-interconnecting the pixels and 132 the RICPs 112.

240 → Aligning the first and second semiconductor structures such that the alignment marks ($a_{ij}$) 132 in the active light sensing region (e.g. electric contacts/pads thereof) are aligned relative of their respective RICPs alignment marks ($a_{ij}$) 112 (e.g. relative to the electric contacts/pads of the RICPs 112), wherein the alignment is performed at a certain alignment temperature that is lower than the freezing temperature of the bumps material.

250 → Joining and electrically coupling between electric contacts of the photodetectors 132 in the active region and the electric contacts of their respective RICPs 112, by heating the first and second semiconductor structures to temperatures above the melting temperature of the material/composition of the interconnects/bumps between them and allowing them to cool to below the freezing temperature of the interconnects/bumps to form uniform bonds between the photodetectors and RICPs.

Fig. 2A

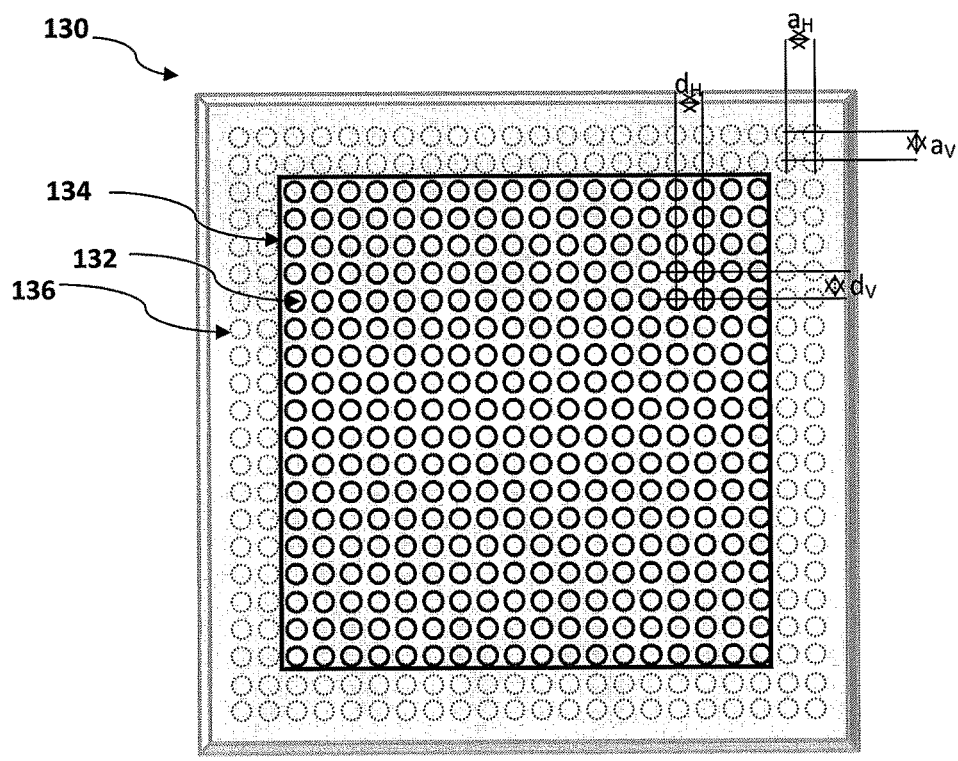
Fig. 2B      T=Alignment temperature
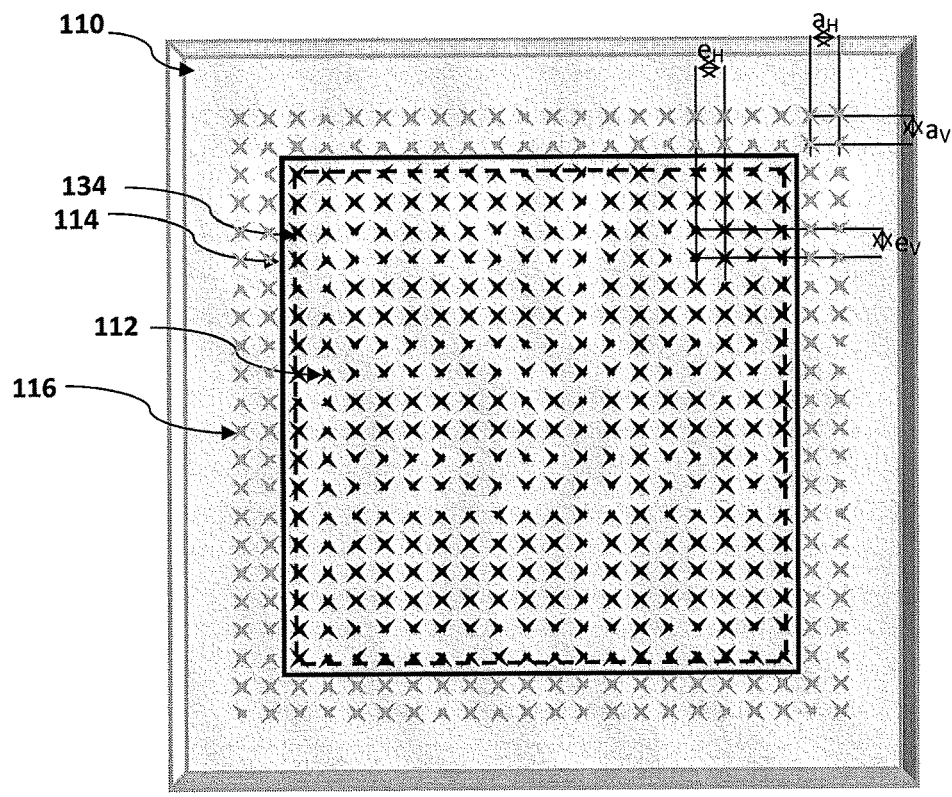
Fig. 2C      T=Alignment temperature

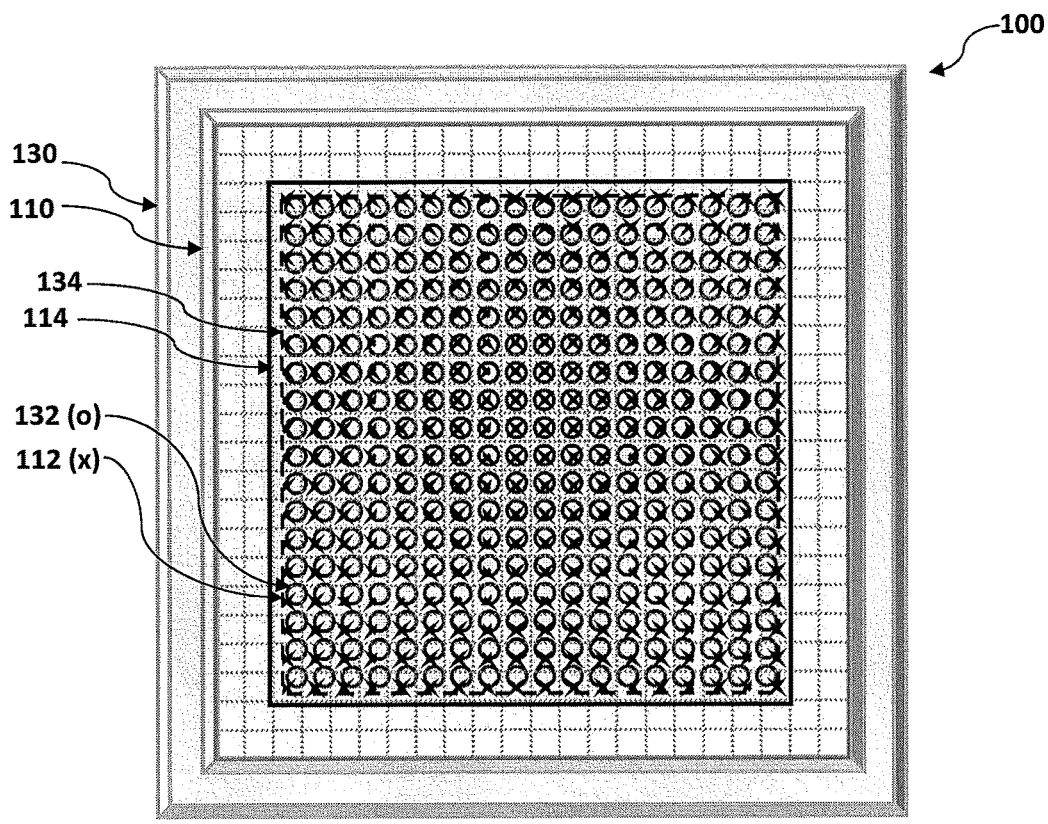
Fig. 2D        T=Alignment temperature
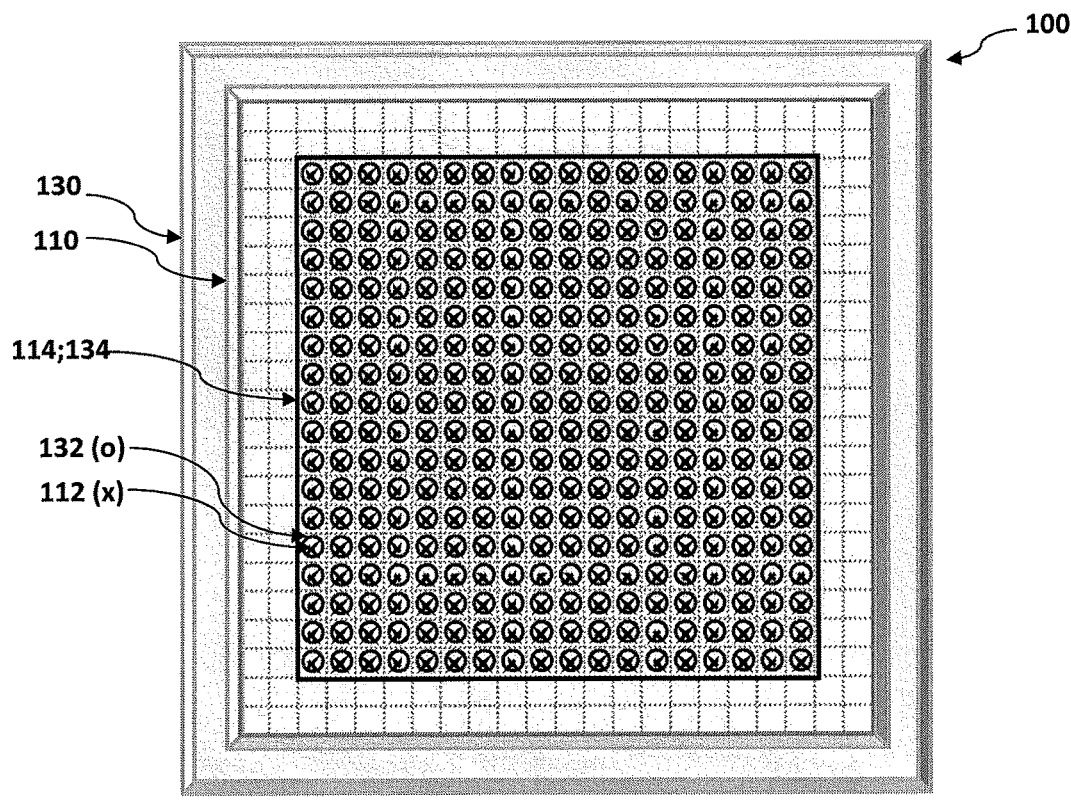
Fig. 2E        T=Freezing temperature

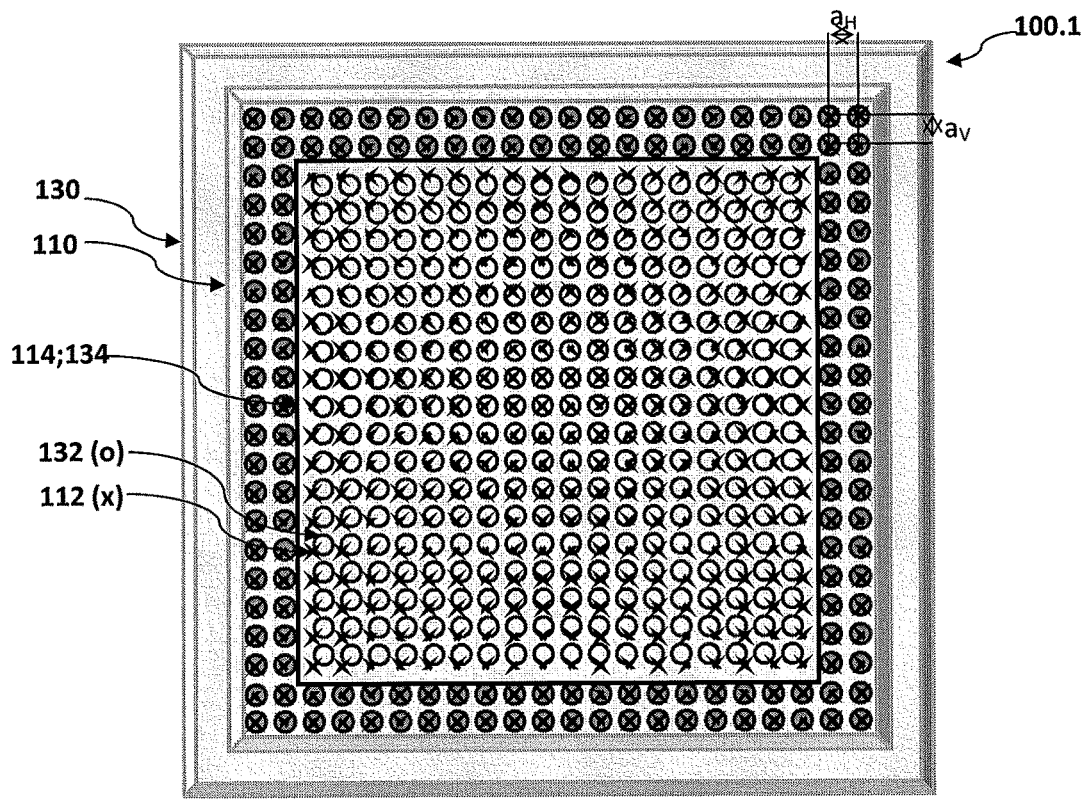
Fig. 3A    T=Alignment temperature
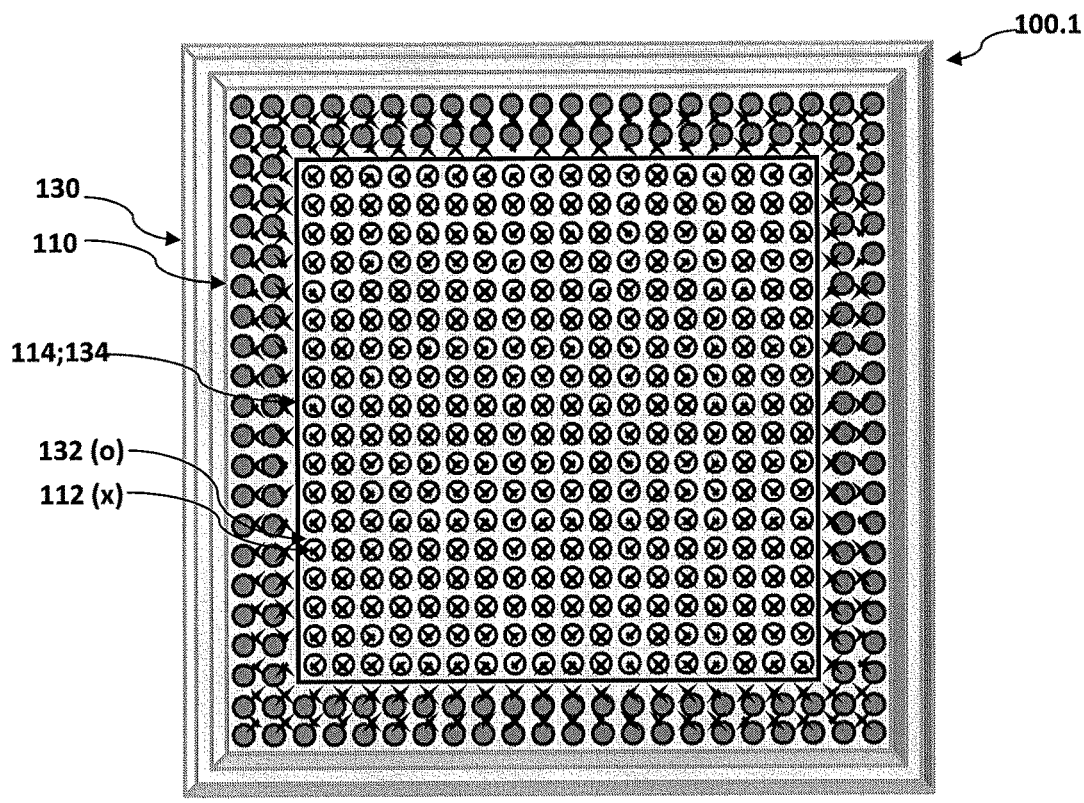
Fig. 3B    T=Freezing temperature

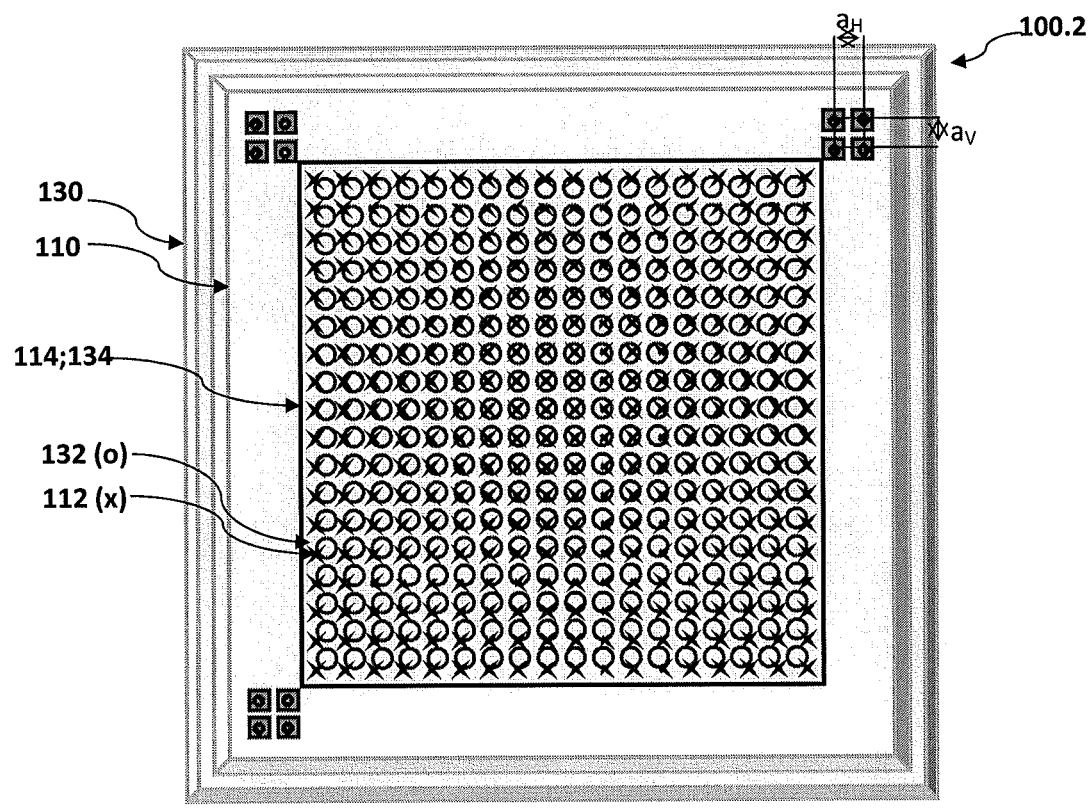
Fig. 4A       T=Alignment temperature
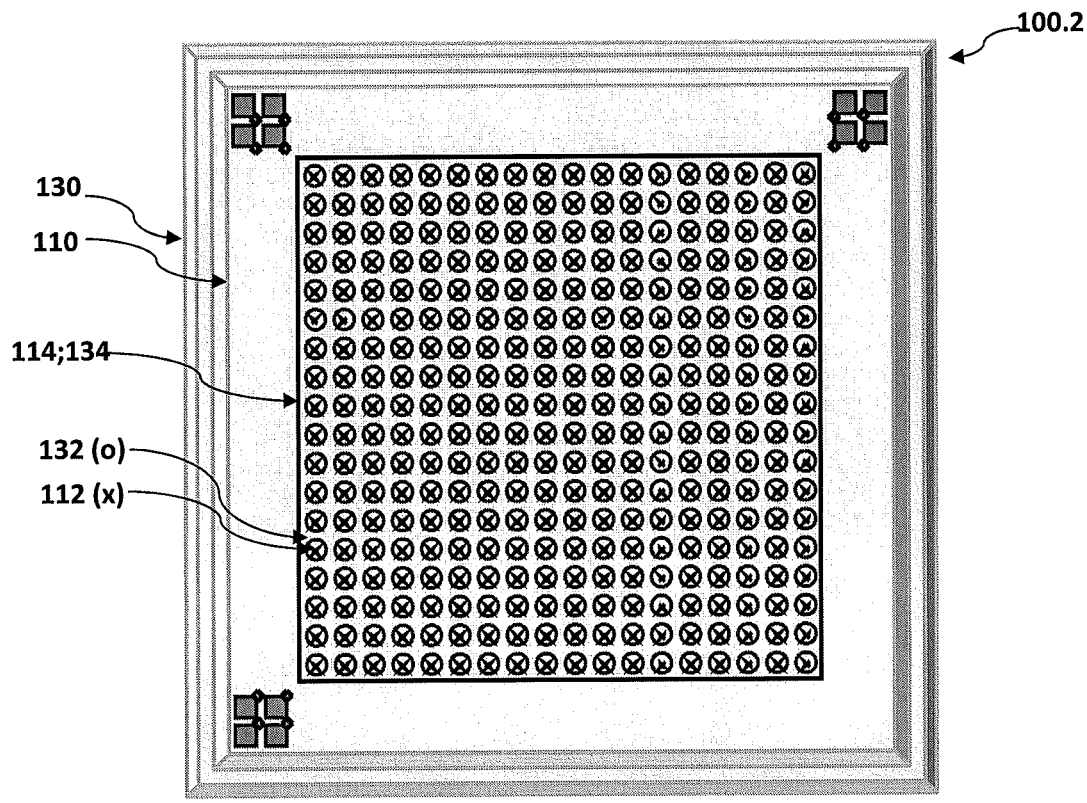
Fig. 4B       T=Alignment temperature Disconnected pixels # = 7 ( < 0.001%)

Disconnected pixels # = 2983 ( ~ 0.25%)

Disconnected pixels # = 34021 ( ~ 2.5%)

PHOTODETECTOR-ARRAYS AND METHODS OF FABRICATION THEREOF

TECHNOLOGICAL FIELD

The invention is in the field of photodetector-arrays, such as image sensors and focal plane arrays (FPA), and to methods of fabrication of such photodetector-arrays.

BACKGROUND

Photodetector-arrays, such as those which are included or which constitute image-sensors and FPAs, generally include an array including a plurality of light/photosensitive detection elements/regions (referred to as photodetectors) which generate photocurrent in response to light impinging thereon, and a corresponding readout integrated circuit (ROIC) including an array of readout integrated circuit pixels (RICPs) capable of receiving and/or storing and/or processing the signals/data indicative of the photocurrents for the respective photodetectors to allow further readout of these signals/data by an external processing utility such as an image processing unit (IPU) and/or a graphical processing unit (GPU). In the following description the term pixel designates a photodetector (e.g. light-sensitive-detection-region/element) and its respective RICP electrically connected together, and the term photodetector-array designates an array of such pixels. Photodetector-arrays are used in a variety of fields to capture and record spatial, spectral and/or temporal light signatures (hereinafter generally referred to as images) coming from objects/scenes. The images and/or light signatures are captured on a plurality of detection elements, where different photodetectors of the image sensors capture different spatial and/or spectral portions of the object/scene that needs to be recorded.

Conventional photodetector-arrays (configured and/or fabricated using known in the art techniques), generally typically include a plurality of dysfunctioning pixels (i.e. defective/dead pixels), from which a proper electric signal indicative of the photocurrent/intensity-of-the-light-falling-thereon, cannot be extracted. For some applications, it is possible to make compromises and use less than perfect photodetector-arrays that may include a few or more defective/dead pixels. For other applications, strict, post fabrication quality inspections are conducted during/after the manufacturing procedure of the photodetector-arrays to identify and dispose of faulty photodetector-arrays in which the number and/or density of defective pixels exceeds a certain tolerable value. This leads to substantial increase of production costs and waste, especially in cases where the allowable/tolerable number/density of defective pixels is small, or in cases where existence of defective pixels is not allowed.

Accordingly, there are various known in the art techniques which are aimed at dealing with the existence of defective pixels. For instance U.S. Pat. No. 7,786,438 discloses a sensor assembly that replaces a single focal plane array detector with two focal plane array detectors. The two focal plane array detectors are orientated with respect to each other such that a power splitter divides an incoming light source equally between each detector. The two detectors are selected such that the locations of poorly-operating pixels in each detector do not overlay. The output signals of each detector are then electronically or analytically combined to yield 100 percent operability.

Other techniques are aimed at reducing defect density in the semiconductor devices. For example U.S. patent application No. 2004/121507 discloses a method of making a semiconductor device having a predetermined epitaxial region, such as an active region, with reduced defect density. The method includes the steps of: (a) forming a dielectric cladding region on a major surface of a single crystal body of a first material; (b) forming a first opening that extends to a first depth into the cladding region; (c) forming a smaller second opening, within the first opening, that extends to a second depth greater than the first depth and that exposes an underlying portion of the major surface of the single crystal body; (d) epitaxially growing regions of a second semiconductor material in each of the openings and on the top of the cladding region; (e) controlling the dimensions of the second opening so that defects are confined to the epitaxial regions grown within the second opening and on top of the cladding region, a first predetermined region being located within the first opening and being essentially free of defects; (f) planarizing the top of the device to remove all epitaxial regions that extend above the top of the cladding layer, thereby making the top of the first predetermined region grown in the second opening essentially flush with the top of the cladding region; and (g) performing additional steps to complete the fabrication of the device. Also described are unique devices, such as photodetectors and MOSFETs, fabricated by this method, as well as unique contacting configurations that enhance their performance.

Also, an attempt to reduce dysfunctional pixels is described in "*Low Temperature Fluxless Technology for Ultra-fine Pitch and Large Devices Flip-chip Bonding*" by C. Davoine, M. Fendler, F. Marion, C. Louis, G. Destefanis, R. Fortunier, Electronics Packaging Technology Conference, 2005, According to this technique, room temperature interconnection technology is used to obtain flip-chip bonding between the detector die and the ROIC die at room temperature, in order to reduce residual strain and warpage of the assembly due to coefficients of thermal expansion (CTE) mismatch between the dies.

General Description

The present invention relates to image sensors and FPAs which are configured as hetero sensor chip assemblies (HSCA) including a detector die, being a first semiconductor structure fabricated with a first semiconductor technology/material and a readout integrated circuit (ROIC) die, being a second semiconductor structure fabricated with a second semiconductor technology/material different than the first semiconductor technology.

It should be noted that the phrase semiconductor technology is used herein to refer to semiconductor structures whose layers are made using particular types of semiconductor materials/compositions and/or super-lattices, and to methods of fabrication of such structures. In this sense the phrase different semiconductor technologies refers to semiconductor structures/methods of particular types of semiconductor materials/compositions and/or super-lattices. In this regard, in the framework of the present invention, a difference in the CTEs of different semiconductor technologies in the HSCA is particularly significant.

Typically, the HSCA defines a two dimensional array of pixels, each comprising a light sensitive region/element (hereinafter referred to as a photodetector) in the first semiconductor structure of the detector die and a corresponding ROIC in the second semiconductor structure of the ROIC die. To this end, the first semiconductor structure defines a matrix/array of light sensitive regions (photodetectors), and the second semiconductor structure defines a complementary matrix/array of readout integrated circuit pixels (RICPs). The first and second semiconductor structures are coupled with electrical interconnects (bumps) between the respective photodetectors and RICPs, for example by flip-chip bonding/configuration which can be followed by a so called reflow process. More specifically, a flip chip bonding process typically includes the following steps:
1. Aligning the ROIC and photodetector pixels at a certain temperature. Alignment temperature is lower than the melting/freezing point of the metal bumps.
2. Applying force in order to bring in contact opposite bumps.
3. In the reflow process the already connected HSCA is heated above the melting/freezing temperature of the metal the bumps are made-of, and cooling down to form a better connected bond.

As a result the array of photodetectors is electrically connected to the array of RICPs, such that the photocurrent from the photodetectors is received and stored/processed by respective RICPs.

In many cases, in particular where image-sensors/FPAs configured for sensing light in spectral bands other than the visual band (e.g. IR sensors), are concerned the first semiconductor structure, in which the light sensitive photodetectors are defined, and the second semiconductor structure (ROIC), in which the RICPs are defined, are made of different semiconductor technologies/materials. For instance, the semiconductor structure of the ROIC may be made using Silicon (Si) semiconductor technology/material, while the semiconductor structures defining the light sensitive photodetectors in some IR ranges may be configured/made using type III-V semiconductor technology/material-compositions and/or using type II-VI semiconductor technology/material-compositions, such as Mercury Cadmium Telluride (MCT), or may be configured and operable as HSCA sensors for sensing radiation in other spectral ranges, such as X-Ray and/or ultraviolet (UV) range.

Modern image sensors and FPAs include millions of pixels. For the pixels to work properly, there is a need for good alignment and good electrical contact between the correlative photodetectors of the detector and the readout integrated circuits ROIC.

The inventors of the present invention have noted that in many cases, mismatch between the CTEs of the first and second semiconductor structures (the photodetectors and ROICs semiconductor structures) results in dead/dysfunctioning pixels in the photodetector-array. This is because during the process of electrical bonding between the photodetector and ROIC pixels (RICPs), which is carried out at relatively high temperatures (e.g. in the order of 150° C. to 250° C.), there exists misalignment between the photodetectors and ROICs (due to difference in their CTEs), which in turn results in not all photodetectors being properly electrically connected to their respective RICPs.

To solve this, the present invention, in a first aspect thereof, provides a novel method for fabricating a photodetector-array. The method includes:
providing a first semiconductor structure made according to a first semiconductor technology having a first coefficient of thermal expansion (CTE) and including an active region including a plurality of light sensitive regions associated with respective electric contacts. The light sensitive regions serve as active photodetectors of the photodetector-array.
providing a second semiconductor structure made according to a second semiconductor technology having a second CTE. The second semiconductor structure includes a plurality of active readout integrated circuits pixels (RICPs) configured and operable for carrying out readout operations from the active photodetectors. To this end the RICPs have respective electric contacts for connecting to the electric contacts of the active photodetectors;
aligning the first and second semiconductor structures at first temperature conditions such that the array of active photodetectors is substantially parallel and aligned with the array of active readout circuits; and
carrying out electrical coupling between the electric contacts of the active photodetectors and the respective electric contacts of the RICPs.

The first and second CTE of the first and second semiconductor structures may not match. Therefore, according to the present invention, the pitch distances of the electric contacts of the active photodetectors in the first semiconductor structure and pitch distances of the respective electric contacts of the active RICPs in the second semiconductor structure are configured in accordance with a difference between the first and second CTEs such that at high temperatures (at which the electrical coupling is performed) the electric contacts of the active photodetectors overlap with respective ones of the readout electric contacts of the active readout circuits.

In some embodiments of the present invention, the pitch distances of the electric contacts and the pitch distances of the respective electric contacts are selected such that at these high temperatures, most (e.g. 99.5% or more preferably more than 99.9%), or all, of the active photodetectors are respectively electrically coupled exclusively to their respective RICPs.

In some embodiments of the present invention the electrical coupling further comprises cooldown of the first and second semiconductor structures after the electrical coupling is performed while maintaining the exclusive electrical coupling between all the active photodetectors and respective RICPs thereof.

In some embodiments of the present invention the electrical coupling is performed by soldering electrical connection bumps between electrical contacts of the first and second semiconductor structures. In some embodiments the soldering includes heating the first and second semiconductor structures to the high temperature which is above a melting temperature of the electrical connection bumps. In some embodiments the electrical coupling includes a reflow process at which the first and second semiconductor structures are heated to high temperature being in the order of 150° C. to 250° C. It is noted that in some embodiments improved bonding is achieved by bonding the first and second semiconductor structures in "non-reflow" process. In such "non-reflow" process the first and second semiconductor structures are pressed together to contact their opposing electrical connection bumps, and are heated to temperatures that are below the melting temperature of the electrical connection bumps.

In some embodiments of the present invention the electrical coupling further includes cooling of first and second semiconductor structures to freezing temperature of the electrical connection bumps. The pitches of the electric contacts of the active photodetectors and pitches of the respective electric contacts of the RICPs are arranged such that, at the freezing temperature, the electric contacts of the active photodetectors overlap with corresponding respective electric contacts of the RICPs.

In some embodiments of the present invention the pitch distances of the electric contacts of the active photodetectors and the pitch distances of the respective electric contacts of the RICPs substantially do not match at a temperature at which the aligning is performed.

In some embodiments of the present invention the array of active photodetectors includes more than 1280×1024 active photodetectors with a pitch of 10 microns and preferably includes about 1920×1536 active photodetectors with a pitch of 10 microns.

In some embodiments of the present invention the first semiconductor structure includes two or more alignment features and the second semiconductor structure includes two or more complementary alignment features. The alignment features and the complementary alignment features are arranged such that, at certain alignment temperatures, at which the alignment is performed (which is substantially lower than the high temperature of the reflow), the displacements between pairs of the alignment features match displacements between respective pairs of the complementary alignment features. This thereby facilitates achieving accurate alignment between the first and second semiconductor structures during the aligning (for example by locating the first and second semiconductor structures such that the alignment features and the second alignment features are co-aligned). In some embodiments the alignment temperature is within the range from about an ambient temperature and not exceeding freezing temperature of electrical connection bumps used to couple the first and second semiconductor structures (e.g. in the range between 20-120° C.).

In some embodiments of the present invention the alignment features include one or more alignment features arranged at a peripheral region surrounding the active photodetectors, and the complementary alignment features include one or more features similarly arranged at a peripheral region outside a region of the active RICPs. In some embodiments the alignment features and the complementary alignment features include respective alignment marks made in the first and second semiconductor structures. In some embodiments the alignment features include a group of non-active photodetectors in the first semi-conductor structure. Also, in some embodiments, during electrical coupling, at least some non-active photodetectors of the group of non-active photodetectors are electrically coupled to a Common contact of the second semiconductor structure. In some embodiments the complementary alignment features include a group of non-active RICPs in the second semiconductor structure. To this end, in some embodiments the non-active RICPs are associated with ground or common contacts of the second semiconductor structure.

In some embodiments of the present invention the method of includes at least one of the following operations:
  providing at least one of the first and second semiconductor structures in the form of a thin film structure;
  mechanically attaching at least one semiconductor structure of the first and second semiconductor structures to a stabilizing structure made of a material composition having different CTE than the at least one semiconductor structure; and
  placing bond materials between the first and second semiconductor structures;
thereby providing mechanical stabilization of the photodetector-array against stresses and/or strains formed between the first and second semiconductor structures at temperatures lower than the high temperature.

In some embodiments of the present invention the first semi-conductor structure comprises one of the following semiconductor materials: group III-V, group II-VI, group IV-VI, and group IV; and the second semi-conductor structure comprises silicon (Si) semiconductor material.

In another aspect, the present invention provides a novel photodetector-array that includes:
  a first semiconductor structure made according to a first semiconductor technology having a first coefficient of thermal expansion (CTE) and comprising an active region including a plurality of active photodetectors each including a light sensitive region of the first semiconductor structure and respective electric contacts;
  a second semiconductor structure made according to a second semiconductor technology having a second CTE different than the first CTE and including a plurality of active readout integrated circuit pixels (RICPs) configured and operable for carrying out readout operations from the active photodetectors. The RICPs have respective electric contacts for connecting to the electric contacts of the active photodetectors.

A photodetector-array, which is configured according to embodiments of the present invention and/or fabricated/assembled by the method of the present invention, can/might be identified and/or distinguished from photodetector-arrays fabricated/configured according to other techniques, in that a photodetector-array of the invention may include an active region, which includes a continuous array of mostly fully functional (non-defective) active pixels (with more than 99.5% functional pixels). In some embodiments about 99.9% of the active pixels are properly electrically connected to their respective RICPs. In other words, the continuous array of functional pixels is continuous in the sense that not more than 0.5% of the pixels in the active region are defective pixels and preferably not more than 0.1% of defective pixels (namely having mal connection to their respective RICPs or other defect) exists among (located between) the active pixels in the active region. In this regard it is noted that according to some embodiments of the present invention, the lateral size/dimension of the active region (of the array of active pixels) extends at least 1920 pixels along at least one lateral direction/axis. To this end, it should be noted that lateral extent/size of some conventional HSCA photo-detectors arrays, such as those comprising InSb materials do not exceed 1280 pixels alone any lateral direction, without having many (>2%) defective pixels not properly electrically connected to their respective RICPs.

To this end, much smaller photodetector-arrays (e.g. with a fewer number of elements (pixels), are obtained when using conventional techniques for coupling detector dies to ROIC dies by reflow process, as compared to the achievable size/number of elements in the technique of the present invention. For example, conventional techniques allow fabrication of HSCA with InSb photodetection die and Si ROICs die with an array of about 1280*1024 elements/pixels arranged with 15 micron pitch. Above this size/number of elements, using a reflow process according to conventional techniques results in too many defective pixels (e.g. more than about 2%). Indeed, achieving a higher number/density of pixels in conventional techniques is possible by the use of cold coupling techniques (not reflow techniques, such as room temperature interconnection technologies). However, the latter has major disadvantages associated with low quality of the coupling/electric contacts between the dies and/or non-uniform coupling. In comparison, the technique of the present invention enables fabrication of HSCA including InSb photodetection and Si ROIC dies, with more than twice the number of elements and with similar dimensions (e.g. the present technique allows fabricating an array of similar 1920*1536 elements from these materials with a pitch of only 10 microns namely with about twice the density obtained in conventional reflow based techniques), while using reflow to couple the photodetection and ROIC dies. Experiments for fabrications of such an HSCA (having InSb photodetection and Si ROIC dies and defining 1920*1536 elements arranged with pitch of 10 microns) by using the conventional reflow techniques have resulted in too many defective pixels, more than about 2% of the pixels. In a similar manner, the technique of the present invention enables fabrication of HSCA including a GaSb based photodetection die and a Si ROIC die with an array of 1920*1536 with 10 micron pitch. In comparison, conventional techniques, which are based on the reflow process, obtain arrays of 640*512 elements/pixels with 15 micron pitch, when using these materials. To this end the present invention has a significant advantage over conventional techniques, as it allows to fabricate HSCA with pixel arrays having a significantly higher number of elements and/or significantly higher density of the elements, while using hot bonding (e.g. bonding based on reflow process) reflow between the photodetection and ROIC dies.

Alternatively or additionally, a photodetector-array, which is configured/fabricated according to an embodiments of the present invention, can/might be identified and/or distinguished from conventional photodetector-arrays in that it includes: (a) an array of active pixels which are associated/arranged with a first pitch distance between them; and (b) a plurality of alignment features/markers (e.g. which are used for aligning between the first (photodetectors) and second (ROIC) semiconductor structure), associated with a second pitch distance between them different than the first pitch distance of the active pixels.

Alternatively or additionally, a photodetector-array, which is configured/fabricated according to an embodiment of the present invention, can/might be identified and/or distinguished from conventional photodetector-arrays, in that the plurality of alignment features markers are arranged in the periphery of the array of active pixels (e.g. at a region outside/surrounding the continuous array of active pixels).

In some embodiments of the photodetector-array of the invention, the arrangement and pitch distances between the electric contacts of the active photodetectors in the active region match an arrangement and pitch distances between the electric contacts of the RICPs. Accordingly, the electric contacts of all or most (e.g. 99.9% or more) of the active photodetectors are aligned with, and are properly electrically connected to electric contacts of respective RICPs. Also in some embodiments the electric contacts of the active photodetectors are electrically connected exclusively to the electric contacts of respective RICPs.

In some embodiments the active photodetectors are arranged in the active region in a regular two dimensional array layout defining rows and columns of the active photodetectors, with even horizontal and vertical spacing between respectively adjacent rows and adjacent columns. The active RICPs are arranged in a two dimensional array layout similar spacing between respectively adjacent rows and adjacent columns of the two dimensional array as in the regular array layout of the active photodetectors. The first and second semiconductor structures are bonded to each other in flip chip bonding configuration and the electrical contacts of the active photodetectors are soldered to the electrical contacts of the RICPs with soldering bumps.

In some embodiments of the present invention the first semiconductor structure includes two or more alignment features located outside the active region, and the second semiconductor structure includes two or more complementary alignment features with arrangement matching to the two or more alignment features. The first semiconductor and second semiconductor structures are assembled and bonded together, such that the pitch distances between at least some of the two or more alignment features are different than pitch distances between the corresponding ones of the two or more complementary alignment features, at the final assembled device. Namely, the pitches and arrangement of the alignment features and their complementary alignment features match during an intermediate alignment stage/temperature of the assembly of the device (e.g. but don't match at the reflow stage at which the dies are coupled/bonded together).

As indicated above in some embodiments of the photodetector-array of the invention, the alignment features and/or the complementary alignment features may include respective alignment marks and/or complementary alignment marks which are made in the first and/or second semiconductor structures. Alternatively or additionally, the alignment features may include non-active photodetectors in the first semi-conductor structure located outside the active region. In some cases the alignment features are associated with overlapping contact pads in the first and second semiconductor structures which provide Common contact between the first and second semiconductor structures.

According to some embodiments, the photodetector-array of the present invention includes at least one of the following features which mechanically stabilizes the photodetector-array against stresses and/or strains formed due to differences in the CTEs of the first and second semiconductor structures:

- at least one of the first and second semiconductor structures in the form of a thin film structure;
- a stabilizing structure attached to at least one of the semiconductor structures and having different CTE than the CTE of the one semiconductor structure; and
- bonding materials placed between the first and second semiconductor structures.

In some embodiments the photodetector-array includes more than 1280×1024 active photodetectors arranged with a pitch of 10 microns, and more preferably includes about 1920×1536 active photodetectors with a pitch of 10 microns.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 2A is a flow chart of a method for fabricating a photodetector-array of a hetero sensor chip assembly (HSCA) according to an embodiment of the present invention;

FIGS. 2B and 2C are schematic illustrations of respective first and second semiconductor structures of an HSCA according to certain embodiments of the present invention, which include a plurality of light sensitive regions (photodetectors) and a plurality of readout circuits arranged in an active region of the HSCA;

FIG. 2D is a schematic illustration showing the respective positions of photodetectors and ROICs of in an HSCA during an alignment stage of the assembly/hybridization process of the device;

FIG. 2E is a schematic illustration showing an assembled HSCA according to the present invention, and the relative positions of respective photodetectors and ROICs in an active region of the HSCA;

FIGS. 3A and 3B are schematic illustrations showing the arrangement of photodetectors, ROICs and alignment features in an HSCA according to another embodiment of the present invention in which the alignment features are photodetector elements/regions and ROICs that are located at the periphery outside the active region of the HSCA; FIG. 3A shows the arrangement during an alignment stage of the assembly/hybridization process and FIG. 3B shows the arrangement in the assembled HSCA;

FIGS. 4A and 4B are schematic illustrations showing the arrangement of photodetectors, RICPs and alignment features in an HSCA according to another embodiment of the present invention in which the alignment features are alignment marks located at corners of the active region; FIG. 4A shows the arrangement during an alignment stage of the assembly/hybridization process and FIG. 3B shows the arrangement in the assembled HSCA;

FIG. 5A exemplifies the number and distribution of disconnected pixels in the active region of an HSCA configured and fabricated according to the technique of the present invention, and FIGS. 5B and 5C exemplify the number and distribution of disconnected pixels in HSCA configured and fabricated according to conventional techniques.

DETAILED DESCRIPTION OF EMBODIMENTS

Figure 1A:
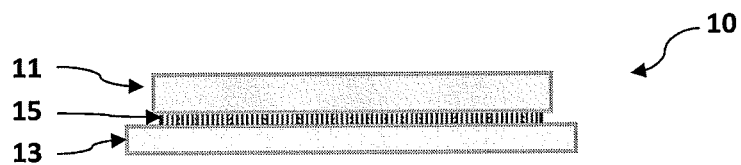
FIGS. 1A to 1D are schematic illustrations exemplifying alignment/misalignment between photo detection elements when attempting to fabricate an HSCA defining large pixel array according to a conventional HSCA fabrication technique.
Figure 1B:
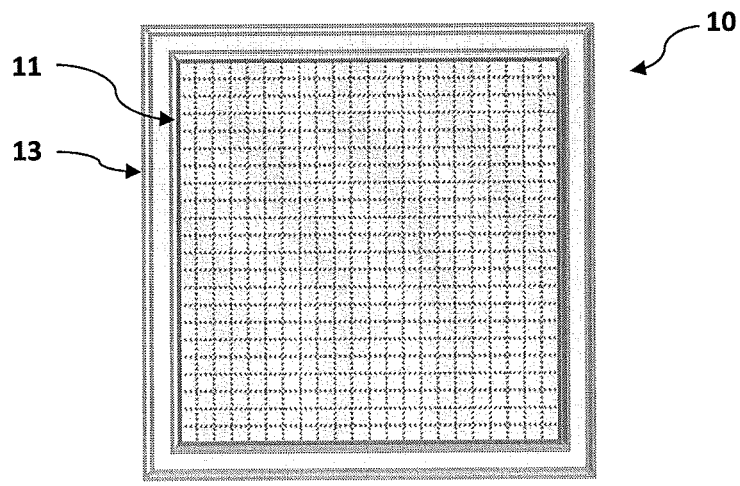

FIGS. 1A to 1E illustrate schematically a configuration of a hetero sensor chip assembly 10 (HSCA) according to the general art. A detection structure 11 (detection die), defining a plurality of light sensitive photodetectors 151 (illustratively marked by O in the figures) is coupled to a readout integrated circuit ROIC 13, via one or more electrical interconnects 15 (bumps—typically made of indium). The detection structure 11, is made according to a certain semiconductor technology (e.g. InGaAs or InSb or MCT) that is suitable for sensing the desired wavelengths for which the HSCA is designed, and the readout integrated circuit (ROIC) 13 is made according to another semiconductor technology (typically a Silicon semiconductor). The readout integrated circuit ROIC 13 includes a plurality of pixel readout circuits (RICPs) 152 (illustratively marked by X in the figures), which should ideally be electrically connected to respective light sensitive photodetectors 151 of the detection structure 11, to allow collection/storing and further readout of the photocurrent generated by the respective light sensitive photodetectors.

However, in conventional HSCA configurations, the process of hybridization, in which the detection structure 11 is coupled and electrically interconnected to the ROIC 13 (e.g. by a reflow process of the inter-contacting bumps) typically results in not all of the photodetectors 151 of the detection structure 11 being electrically connected to their respective RICPs 152 of the silicon ROIC 13. Consequently, the number of active pixels in the array is limited.

The inventors of the present invention have noted that not all the photodetectors 151 of the detection structure 11 are properly electrically connected to their respective RICPs 152, even in cases when during the hybridization process the array of photodetectors 152 in the detection structure 11 is properly aligned to the array of RICPs 152 in the ROIC 13 (such that each photodetector 151 faces its counterpart RICP). This is because that when these arrays of photodetectors 151 and RICPs 152 are brought together and bonded using heat, some of the photodetectors become misaligned relative to their respective RICPs, due to a difference between the thermal expansion coefficients of the detection structure 11 and the ROIC 13. More specifically, the difference in expansion of the detection structure 11 and the ROIC 13 strains the indium interconnects 15, particularly at the perimeter of the detector 11 and therefore when the interconnect joints occur at the freeze point of the interconnect metal, some of the interconnects are not aligned at the freeze temperatures and the electrical interconnection/bond is not formed.

Figure 1C:
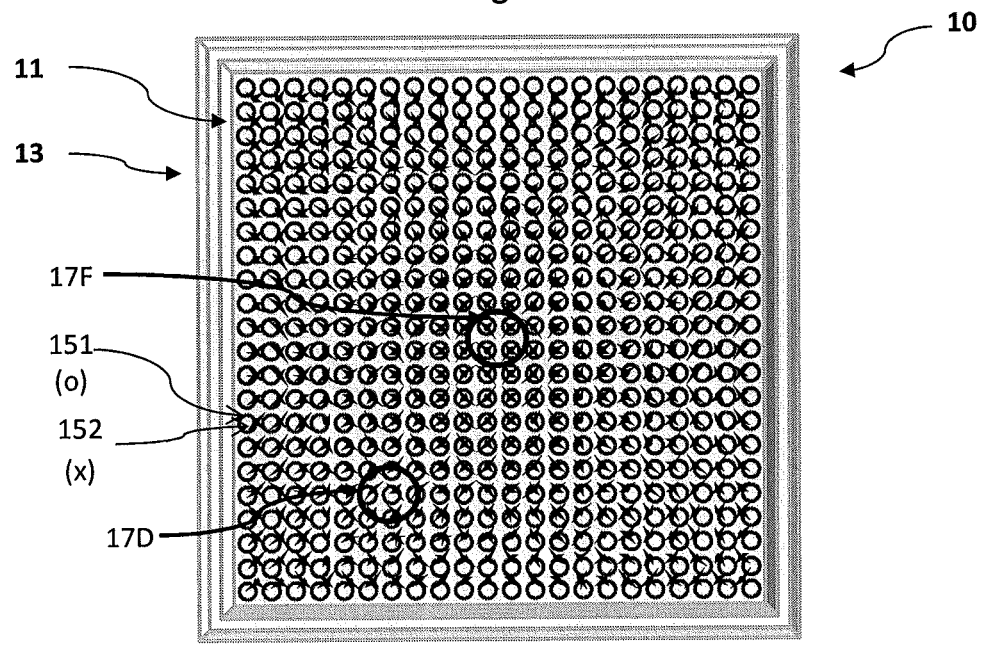
Figure 1D:
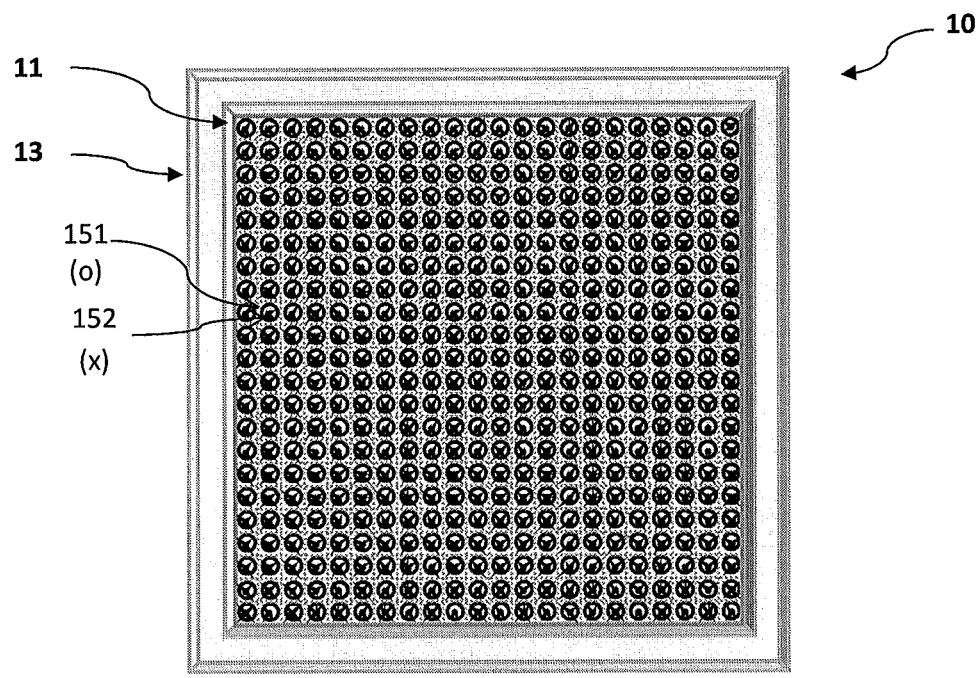

For example, FIG. 1D shows, schematically, precise alignment between the photodetectors and their respective RICPs 152, at the alignment operation before the bonding. FIG. 1C exemplifies possible misalignment between various photodetectors 151 and RICPs 152 in a large HSCA pixel array that is bonded/jointed using conventional reflow techniques (e.g. after the HSCA was heated to temperatures above the melting temperature of the electrical interconnects/bumps 15 and cooled down to temperatures below the freezing temperature of the electrical interconnects/bumps 15).

Figure 1E:
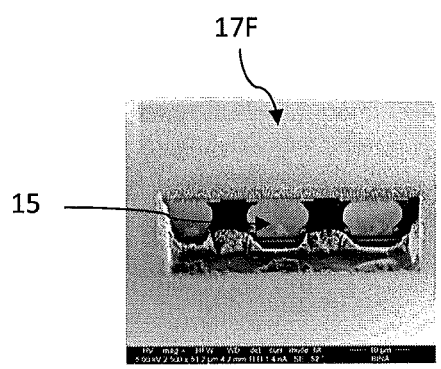
FIGS. 1E and 1F are pictures of well bonded and disconnected bumps/interconnects between light sensitive photodetectors and ROICs in conventional image sensors.
Figure 1F:
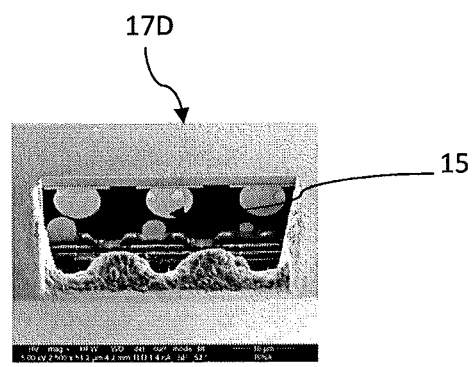

In some cases, as a result of the difference between the CTEs of the detection structure 11 and the ROIC 13, the detection structure 11 expands 2-4 times more than the silicon ROIC 13 to which it should be coupled. Therefore, using conventional HSCA configurations and fabrication methods leads to improper/defective/dysfunctional electrical connection between some/many photodetectors and RICPs, which in turn results in dead/defective pixels in conventional HSCAs. For example, FIG. 1C illustrates a functioning pixel 17F in which the RICP is properly connected to the photodetector, and a dysfunctioning/defective pixel 17D, whose RICP is not connected or not properly electrically connected to the photodetector. Respectively, FIGS. 1E and 1F show images of the electrical interconnects 15 of functioning and dysfunctioning pixels, such as 17F, 17D, in which the electrical interconnect bumps 15 are respectively, properly and improperly, bonded/jointed RICPs to their respective photodetector.

An attempt to overcome the above problem by bonding the detector 11 and the ROIC 13 at room temperature (as described for example in the article *Low Temperature Fluxless Technology for Ultra-fine Pitch and Large Devices Flip-chip Bonding* indicated above), has major deficiencies associated with weaker bonding between the ROICs and the detection structure; such bonding does not benefit from self alignment of the bumps and therefore requires good contact between all correlated bumps.

FIG. 2A shows a flow chart 200 schematically illustrating a method according to an embodiment of the present invention for fabricating a photodetector-array configured as HSCA. The HSCA fabricated by method 200 includes a photodetection- and a ROIC-semiconductor structure, configured such that, in an active region of the photodetector-array, substantially all of the electrical connections between the photosensitive regions/elements (photodetectors) in the photodetective semiconductor structure/die are properly electrically interconnected to their respective RICPs in the ROICs semiconductor structure/die.

It is noted that in the present disclosure the term pixel is used to designate a light sensitive region/element (photodetector) in the first semiconductor structure together with and/or electrically connected to its respective RICP in the second semiconductor structure. Also, the terms pitch, pitch distance, spacing, and/or displacement are used herein interchangeably to designate/refer to the horizontal and/or vertical distances between the centers of elements/features, such as photodetectors and RICPs, alignment marks/features and/or other elements in the first and second semiconductor structures. In this sense, as elements, such as photodetectors and RICPs, are in many cases arranged in ordered/regular arrays/matrix layout, the terms spacing, pitch, displacement and/or pitch distance may also refer/relate to the actual sizes (lateral, vertical/horizontal) dimensions of the elements. In this regard, since elements, such as photodetectors and RICPs, generally include their respective electric contact pads/bumps, whose sizes often scale with the size of their respective elements, therefore the following the terms spacing, pitch, pitch distance. displacement and/or size are also used to designate the pitches/sizes of the respective electric contact pads/bumps of such elements. The latter may be visible on a surface to the first/second semiconductor structures, thus allowing to visually identify HSCAs in which the arrangement/pitches of electric contacts of elements (e.g. photodetectors, RICPs, and/or alignment features) are made to correspond the technique of the present invention, as described and exemplified in more detail below.

The active region of the photodetector-array includes a continuous arrangement/layout/array of operative/functioning pixels in which the photodetectors are well connected to the RICPs (e.g. continuous in the sense 99% or more (e.g. 99.5%) and the pixels in the active region are properly electrically connected to their respective ROICs. For instance, the active region may include less than 1% or even no more than 0.5% of defective pixels, in which the photodetectors are disconnected from their respective RICPs, between the active pixels. In other words, in the absence of other types of defects, such as defects in the lattice/layer structures of the photodetection die/semiconductor-structure or in the ROIC die/semiconductor-structure, at least 99% or 99.5% of the pixels in the active region may be active/operative/functioning pixels. The active region may thus span a substantially continuous array of operative pixels with less than a total of 1% or less than a total of 0.5% dead or dysfunctioning pixels between them (the amount of defective pixels which are defects are due to mal electric connection between the photodetection element and it respective RCIP which does not exceed 0.1%).

In some embodiments the active pixels are arranged in the active region in an ordered two dimensional array of operative/functioning pixels, which are regularly spaced from one another (e.g. with even spacing between them along each dimension of the array).

According to the method 200 of the invention, the photodetection and ROIC semiconductor structures/dies may be fabricated/made by different first and second semiconductor technologies (e.g. Type-III-V/InGaAs/GaN/InSb/InAsSb or Type-II-VI HgCdTe/CdZnTe or type-IV-VI/PbSe or type IV Ge and Si semiconductor technologies respectively), and in this sense the method 200 is suitable for fabrication/assembly of hetero sensor chip assemblies.

210 of method 200 includes providing a first semiconductor structure made according to a first semiconductor technology, (which has a first coefficient of thermal expansion (CTE)). FIG. 2B illustrates for example such a first semiconductor structure 130. The first semiconductor structure 130 includes an array of plurality of light sensitive regions (photodetectors) 132 arranged in an active light sensing region 134 of the first semiconductor structure with certain predetermined spacings $\{d_{ij}\}$ between each adjacent pair $\{i,j\}$ of photodetectors (the photodetectors are illustratively marked by O in this and in the following figures). The photodetectors 132 in the active light sensing region 134 are configured and operable for serving as the active/operative pixels of the HSCA. The photodetectors 132 may be associated with respective electric contact pads (not specifically shown) on a surface of the first semiconductor structure 130 and/or they may be defined/separated from one another by trenches/grooves on one or more layers of the first semiconductor structure 130.

Typically, although not necessarily, the photodetectors 132 in the active light sensing region 134 are arranged in a regularly spaced array, spaced from one another with pitches $d_H$ and $d_V$ along the horizontal and vertical dimensions of the array respectively (in many cases $d_H=d_V$). In this regards it should be understood that the technique of the present invention may be implemented also in cases where the photodetectors 132 in the active light sensing region 134 and their corresponding 112 RICPs arranged within an active readout region 114 of the second semiconductor structure 110 are arranged in non regularly spaced arrays and/or with varying spacings between them.

Optionally, additional features 136 (e.g. additional/non-active photodetectors, electric-contacts/pads, markers and/or other features) may also be included in the first semiconductor structure 130. Such additional features 136 may typically be located outside of the active light sensing region 134. In this example the optional additional features 136 are marked by dashed O in FIG. 2B.

220 of method 200 includes providing a second semiconductor structure made according to a second semiconductor technology, (which has a second coefficient of thermal expansion (CTE)). FIG. 2C illustrates for example, a second semiconductor structure 110 provided in operation 220 of method 200. The second semiconductor structure 110 is configured as a readout integrated circuit ROIC, which is configured and operable to read out of signals/data indicative of the photocurrent generated by the photodetectors 132 in the first integrated structure 130. Accordingly the second semiconductor structure 110 includes a complementary array of plurality of readout circuits 112 (RICPs; also referred to in the following as active RICPs) arranged within an active readout region 114 of the second semiconductor structure 110 with a mirror like arrangement reflecting the arrangement of the photodetectors 132 in the active light sensing region 134. The RICPs 112 are arranged with certain predetermined spacings $\{e_{ij}\}$ between each adjacent pairs $\{i,j\}$ of RICPs. The RICPs are illustratively shown, marked by x in this and in the following figures. Typically, although not necessarily, the RICPs 112 in the active readout region 114 are arranged in a regularly spaced array, spaced from one another with pitches $e_H$ and $e_V$ along the horizontal and vertical dimensions of the array respectively (in many cases $e_H=e_V$).

Optionally, additional complementary features 116 (e.g. which may be non-active RICPs, and/or electric-contacts/pads, and/or ground/common contacts, and/or markers and/or other features) may also be included in the second semiconductor structure 110. The additional complementary features 116 are typically located outside of the active readout region 114. In this example the optional additional complementary features 116 are marked by dashed light gray x in FIG. 2C.

As will be further described below, in some embodiments of the invention, the optional additional features 136 and optional additional complementary features 116 may be arranged in a respective mirror like arrangement and serve as alignment features, facilitating/aiding in proper and easy alignment between the arrays of photodetectors and RICPs during an alignment step 240 of method 200, which is described below. Accordingly, in the following the optional additional features 136 and the optional additional complementary features 116 are also referred to in the following as alignment features 136 and complementary alignment features 116 respectively. It should be understood that the alignment features 136 and complementary alignment features 116 may optionally have additional function(s) apart from their use in the alignment stage (240 below). For example, the alignment features 136 and complementary alignment features 116 may be configured and operable to provide good common/ground contact between the first and second semiconductor structures during operation of the HSCA. Apart from that, at least for the purpose of alignment operation (240), the alignment features 136 and complementary alignment features 116 are arranged such that at the temperature at which alignment between the first and second semiconductor structure is performed (hereinafter referred to as alignment temperature), the arrangement of the alignment features and the complementary alignment features mirror one another. For instance, at that temperature, the spacing/pitch distance $a_{nm}$ of respective pairs {n,m} of alignment features 136 match the spacings/pitches $a_{nm}$ of the corresponding pairs {n,m} of complementary alignment features 116. This is illustrated schematically for example in FIGS. 2B and 2C, which shows that the same vertical and horizontal spacings, $a_H$ and $a_V$, exist between corresponding adjacent pairs of the alignment features 136 and complementary alignment features 116 at the alignment temperature.

230 of method 200 comprises providing/configuring the first and second semiconductor structures according to the invention, such that the array of active photodetectors 132 (of the electric contacts thereof) in the active light sensing region 134 and the array of active RICPs 112 in the active readout region 114 (of the readout electric contacts thereof) are complementary and match one another at high temperatures at about the freezing temperature of the material/composition (e.g. of the electrical interconnects/bumps) in which the photodetectors and RICPs are to be electrically-connected and/or bonded/jointed to one another during the fabrication/assembly of the HSCA. More specifically, the array of photodetectors 132 and the array of RICPs 112 match in the sense that their arrangements mirror one another at about the freezing temperature of the material/composition of the electrical interconnects/bumps and/or of the joining bonding material (i.e. the predetermined spacings $\{d_{ij}\}$ and $\{e_{ij}\}$ between corresponding pairs {i,j} of the photodetectors and the RICPs respectively, are substantially equal at about the freezing temperature).

For example, the bumps/electrical-contacts are in many cases made of indium, whose freezing temperature is about 156° C. Accordingly, the first and second semiconductor structures, 130 and 110, are configured such that spacings NO and $\{e_{ij}\}$ between corresponding pairs {i,j} of the photodetectors match at such freezing temperatures (e.g. the horizontal and vertical pitches of the photodetectors and RICPs satisfy p $d_V|_{\sim 150° C.} \approx e_V|_{\sim 150° C.}$ and $d_H|_{\sim 150° C.} \approx e_H|_{\sim 150° C.}$).

Thus at the about the freezing temperature of the electrical-interconnects/bumps the active light sensitive region 134 and the active readout region 114 have about the same size and shape. However, at lower temperatures (e.g. at an ambient temperature of e.g. 25° C. and/or at an alignment temperature (which may be higher than ambient temperature e.g. ~25-120° C.) the spacings $\{d_{ij}\}$ and $\{e_{ij}\}$ and the sizes of the active regions 134 and 114 do not match. Therefore the arrangements of active pixels 132 and active RICPs 112 do not match, when alignment between the first and second semiconductor structure is carried out before their bonding. In this regard, FIGS. 2B and 2C and 2D, show the boundaries of the active regions 134 and/or 114 and the arrangements and inter-spacings between photodetectors and between RICPs when the temperature of the respective first and second semiconductor structures, 130 and 110, is lower than the freezing temperature of the electrical interconnects (e.g. at the alignment temperature of about 65° C.).

The projection of the boundary of the active light sensitive region 134, which is shown in FIG. 2C as a dashed line on the active readout region 114, illustrates that the active light sensitive region 134 is not of the same size as the active light sensitive region 134 at the alignment/ambient temperature. Yet, due to the different coefficients of thermal expansion of the first and second semiconductor structures 130 and 110 of the HSCA, at the freezing temperature of the electrical interconnects, the inter distances/spacings between the photodetectors 132 match the inter distances/spacings between the RICPs 112 and the active light sensitive region 134 and the active readout region 114 are of the same size. As described below, this allows achieving accurate and fully operative electrical coupling between all the photodetectors in the active region 134 to their respective RICPs 112.

It should be noted that typically, specifically in HSCAs designed for IR sensing/imaging, the first light sensing semiconductor structure, is made of materials/compositions having higher CTE(s) than the CTE of the materials (typically Silicon (Si)) of the second, ROIC, semiconductor structure 110. Accordingly, as also illustrated for example in FIGS. 2B, 2C and 2D, at ambient/alignment temperatures, before the first and semiconductor structures are bonded/jointed together, the active light sensing region 134 in the first semiconductor structure 130 and the spacings $d_{ij}$ between the photodetectors, are respectively larger than the active readout region 114 and the spacings $e_{ij}$ between the RICPs in the second semiconductor structure 110.

Operation 240 of method 200, is an alignment operation/step, in which the first and second semiconductor structures are laterally aligned with respect to one another such that when afterwards they are heated to temperature of about/above the freezing temperature of the bonding/joining/bumps' material, the photodetectors 132 (or the electric contacts/pads associated therewith) are aligned with their respective RICPs 112 (e.g. with the electric contacts/pads associated with the RICPs 112). The alignment operation 240 is generally performed at a certain alignment temperature, which is lower than the freezing temperature (and lower than the melting temperature) of the bonding/bumps' material/composition that is used to couple between the photodetectors 132 and RICPs 112 (in some cases the melting temperature may not be the same as, or may be higher than, the freezing temperature of the bumps' material). For example, alignment may be carried out when the structures are at a certain alignment temperature within the range from low temperature (e.g. 50° C.) or from the ambient temperature 25° C. or below and up to higher temperatures of about 120° C.

FIG. 2D shows the respective positions of photodetectors and RICPs of the HSCA 100 during the alignment stage 240 of the method 200 after the first and second semiconductor structure are aligned, while being at the alignment temperature.

Alignment (also referred to as flip-chip process) is performed such that, at the alignment temperature, the array of active photodetectors 132 (which reside within the active light sensing region 134 of the first semiconductor structure) and the array of active RICPs 112 (which reside in the active readout region 114 of the second semiconductor structure) are located one above the other, substantially parallel to each other with proper/matching orientations, and are centralized (e.g. coaxially) with respect one to the other. Indeed, in the method 200 of the invention, at this stage (240), not all the photodetectors are located exactly above/below their respective RICPs. This is due to the difference between the pitches/spacings between the photodetector and RICPs at the alignment temperature.

To this end, as indicated above, optionally in some embodiments of the invention, additional/alignment features 136 (marked by dashed O in FIG. 2B) and the complementary alignment features 116 are provided in the first and second semiconductor structures, 130 and 110, respectively. Differently from the photodetectors 132 and RICPs 112 in the active regions 134 and 114, which do not have matching spacings between them at the alignment temperature, the alignment 136 and complementary alignment 116 features are configured such that they do have matching and matching arrangement at the alignment temperature. This facilitates easy alignment, between the semiconductor structures 130 and 110, and/or inspection of the alignment between them (e.g. may be visual means), such that after these semiconductor structures 130 and 110 are brought to the freezing temperature of the bumps'/joining/bonding material between them, their photodetectors 132 are located vertically above or below, and aligned with their respective RICPs 114 such that the electric contacts of the active photodetectors 132 overlap with respective readout electric contacts of the active RICPs 112, thus obtaining properly functioning electrically coupling between all the active photodetectors 132 and all the active RICPs after they are jointed together.

After alignment 240, operation 250 is carried out to join and electrical couple between respective ones the electric contacts of the photodetectors 132 and the readout electric contacts of their respective RICPs 112. In order to ensure firm connection between all respective electric contacts (interconnects) of the photodetectors 132 and RICPs 112, the HSCA is submitted to a reflow process in which the interconnect bumps (e.g. indium bumps between the photodetectors and RICPs) are fused to form good and uniform bonds.

During reflow, HSCA 100, including the first and second semiconductor structures 130 and 110, is heated to above the melting temperature of the material/composition of the interconnects/bumps, which are used to join and electrically connect the semiconductor structures 130 and 110 together (e.g., heated to temperatures in the order of 200 C). As the HSCA 100 is heated, the first and second semiconductor structures 130 and 110 of the HSCA 10 expand in different amounts. In typically IR sensor configurations/materials, the first, light sensing semiconductor structure 130 will expand 2-4 times as much as the second ROIC semiconductor structure 110 (e.g. made of silicon) to which it is to be coupled. For instance, if the CTE of the second semiconductor structure 110 (of the Si ROIC) is 2 ppm/° C. (part per million per Celsius degree) and the CTE of the first semiconductor structure 130 (photodetector array) is 6 ppm/° C., then upon heating from ambient/alignment temperature of 25° C. to above the freezing temperature 160° C. the photodetectors 132 will expand by 0.00054 per unit length more than their respective RICPs 112. Therefore, considering an array of elements which has lateral dimension of n elements (e.g. n=2000) arranged with certain pitch e (e.g. e=10 micron), then the elements on the edge will shift by the length of (½)*0.00054*e*n which equals, in this case, 5.4 microns. Since this is in the order of the spacing/pitch between the elements (e.g. more than half the pitch), the edge elements in this state are not aligned with their respective ROICs which inhibits the effectiveness of the reflow process and results in mal electrical connection between them. In order to compensate for this, the photodetectors 132 are made to be smaller by about half that amount. That is, if the dimensions of the active readout region in the second semiconductor structure 110 are about 10 μm×10 μm at 25° C., the dimensions of the active light sensing region (which includes the corresponding array of photodetectors 132) are selected to be about 9.9973 μm×9.9973 μm (2.7 nm smaller than the RICPs array).

Accordingly, as indicated above, the pitches/spacings $d_{ij}$ between the photodetectors are made smaller (or larger) than the spacing between the RICPs, in order to compensate for this difference between the CTEs. Thus, as the HSCA 100 is heated during the reflow process, and the first semiconductor structure (detector die) expands (or possibly contracts) relative to the second semiconductor structure (ROIC die), the alignment of the photodetectors 132 (or their electric contacts/pads) in the active region with their respective RICPs 112 is improved (e.g. the electric contacts/pads of the photodetectors 132 have larger overlap with the electric contacts/pads of the RICPs). This improves the electric contact and coupling between the photodetectors and the respective RICPs in the active region, and allows all the photodetectors in the active region to be properly electrically connected to their respective RICPs. After heating the HSCA 100 to high temperature above the melting temperature of the interconnects'/bumps' material, electric interconnects are formed between the photodetectors and RICPs due to the affinity of the bonds/bumps (e.g. due to the affinity between the melted bump-material/indium and the contact pads of the photodetectors 132 and RICPs 112). As a byproduct, as long as the photodetectors are roughly aligned their respective RICPs, the interconnect contacts/bumps between them are self aligned, from both sides, to their respective photodetectors and their respective ROICs.

Then, the HSCA 100 is cooled to temperature below the freezing temperature of the interconnects'/bumps' material, thus jointing/soldering bumps between the photodetectors and RICPs and forming the electrical interconnects between them.

FIG. 2E shows an example of an HSCA 100 according to the present invention. The HSCA 100 is shown after it was assembled according to method 200 (after the flip-chip and reflow bonding process (operation 250) was conducted, and the HSCA 100 was cooled down to the freezing temperature of the interconnects'/bumps' material or to temperatures below it. Namely this figure illustrates the final configuration of the HSCAs device 100 of these embodiments. Since the arrangements of photodetectors and RICPs according to the present invention is such that the pitches/spacings $d_{ij}$ and $e_{ij}$ between respective active photodetectors 132 (in the active region 134) and respective active RICPs 112 (in the active readout region 114) are substantially matching/equal at the freezing temperature of the bumps/interconnects material, therefore when the HSCA 100 is cooled to the freezing temperature of the bumps/interconnects, good electric and mechanical contact is formed between all, or at least most of (e.g. >99.9% or above), the photodetectors 132 and RICPs 112.

It is noted that in some embodiments of the present invention the array of active photodetectors 132 in the active region may include more than 1280×1024 active photodetectors 132 for example arranged with a pitch of 10 microns. In some embodiments the array of active photodetectors 132 includes about 1920×1536 active photodetectors 132 with a pitch of 10 microns.

It should be noted that as a result of the self alignment of the bumps in the reflow process, interconnect formation between the photodetectors and RICPs is improved making the technique of the present invention robust and suitable for mass production since it may be tolerable to deviations from precise alignment between corresponding photodetectors and ROICs of up to 10% of a pixel/photodetector pitch and in some cases even tolerable to deviations of up to 20% of the pitch.

When the assembled HSCA is further cooled to the ambient temperature, or to its operation temperature (which may be a cryogenic temperature in case of IR sensors for sensing IR wavelengths in MWIR or longer) then alignment and electric contact between respective photodetectors and the RICPs are maintained since the bumps/interconnects are already solid/frozen at these temperatures. Indeed due to the CTE differences between the first and second semiconductor structures, mechanical stresses/strains may be developed between them at low temperatures (e.g. lower than the freezing temperatures of the bumps). Such mechanical stresses/strains can be handled by various techniques. For example, in some embodiments mechanical stresses/strains are handled by the strength of the bumps/interconnects themselves. Alternatively or additionally, bonding material such as glue may be introduced in between the first and second semiconductor structures (e.g. in between the interconnects) to enforce mechanical coupling between them, and/or other mechanical enforcement structures may be fabricated/or coupled to the device (e.g. metal enforcement structures). Yet alternatively or additionally, in many cases one or both of the first and second semiconductor structures may be fabricated/thinned by polishing, thus making it more flexible, which reduces the magnitude of stresses/strains between the first and second semiconductor structures.

It should be noted that the alignment features 136 and the complementary alignment features 116 or some of them may indeed get misaligned during the reflow/soldering process 250, when the HSCA 100 is brought to the freezing temperature of the bumps/interconnects. However, this does not affect the imaging/light sensing operation of the HSCA since the alignment feature and their complementary features are outside the active region 134 of the HSCA 100 (in the periphery thereof). The active region 134 thus constitutes a continuous region/array of photodetectors which may be all properly electrically connected to their respective RICPs and, in this sense, include fully operative/functional active photodetectors.

FIGS. 3A and 3B and FIGS. 4A and 4B respectively show another two examples of HSCAs 100.1 and 100.2 according to the present invention.

The HSCAs 100.1 and 100.2 shown in FIGS. 3B and 4B are shown after the reflow bonding process (operation 250) was conducted, and the HSCAs 100.1 and 100.2 are cooled down to the freezing temperature of the interconnects'/bumps' material or to temperatures below it. Namely, these figures illustrate the final configuration of the HSCAs devices 100.1 and 100.2 of these embodiments. Each of the HSCAs 100.1 and 100.2 includes an active region 134 constituting a continuous region/array of properly electrically connected photodetectors 132 and RICPs 112, and alignment features 136 at the periphery/perimeter of the active region 134. The array of active photodetectors 132 in the active region may include more than 1280×1024 active photodetectors 132 for example arranged with a pitch of 10 microns. In some embodiments the array of active photodetectors 132 includes about 1920×1536 active photodetectors 132 with a pitch of microns. Photodetectors 132 and RICPs 112 (e.g. the electric contacts/pads thereof) are substantially aligned in these figures. The alignment features 136 of the first semiconductor structure 130 and the complementary alignment features 116 are not necessarily respectively aligned with one another at this stage (at the end of the fabrication when the HSCAs devices 100.1 and 100.2 are assembled and electrically connected).

The HSCAs 100.1 and 100.2 illustrated in FIGS. 3A and 4A are shown during the alignment operation (240 above). As shown in both the FIGS. 3A and 4A the alignment features 136 and the complementary alignment features 116 are configured such that they have matching arrangements and matching/equal respective pitches at the alignment temperature (e.g. the horizontal and vertical pitch distances $a_H$ and $a_V$ are equal/matching for the alignment and complementary alignment features), such that during the alignment operation 240 they serve/aid in aligning the first and second semiconductor structures.

The photodetectors 132 and RICPs 112 are generally not aligned at the alignment temperatures and their respective horizontal and vertical pitch distances, $d_H$ and $d_V$ (of the photodetectors 132), and $e_H$ and $e_V$ (of the RICPs 112) do not match at the alignment temperature. Yet as shown in FIGS. 3B and 4B, the photodetectors and RICPs are configured such that their arrangement and horizontal and vertical pitch distances, $d_H$ and $d_V$, and $e_H$ and $e_V$, match at the freezing temperature of the interconnects'/bumps' material.

In the HSCA embodiment 100.1 of FIGS. 3A and 3B, the alignment features 136 are located at the periphery/perimeter of the active region 134 and include electric contacts similar to those of the photodetectors 132 in the active region. The complementary alignment features 116 located in the periphery of the active readout region 114 include electric contacts similar to those of the RICPs 112 in the active readout region 114. In this example the electric contacts of the alignment, and complementary alignment, features 136 and 116 are all or some redundant electric contacts which are configured and operable to between the first and second semiconductor structures, 130 and 110, of the photodetectors 132 and RICPs 112. In some embodiments, in order to provide the common/ground electric connection, the complementary alignment features 136 and/or 116 are associated with vias of different height than those of the active pixels and their respective ROCs (associated with deeper vias). Alternatively, in some cases the complementary alignment features are coupled to the electric contacts in planar configuration.

Therefore, although the difference in CTEs of the first and second semiconductor structures, causes misalignment and poor or non electric contacts between some of the respective alignment and complementary alignment features, still it does not affect the function/performance of the HSCA 100.1, because of the redundancy in those electric contacts.

In the HSCA embodiment 100.1 of FIGS. 4A and 4B, the alignment features 136 are located at the periphery/perimeter of the active region 134 and include alignment marks which may be formed by any suitable technique (e.g. using dummy contacts, or other features).

It should be noted that in FIGS. 3A and 3B and in FIGS. 4A and 4B, exemplify two different possible arrangements of alignment features 136 and their complementary 116 are illustrated. In FIGS. 3A and 3B they are arranged at the periphery of the active region 134, surrounding its perimeter; and in FIGS. 4A and 4B there are arranged only in some of the corners of the periphery of the active region 136. In this regard other arrangements of the alignment features at the periphery of the active region are also possible in various embodiments of the present invention, or no alignment features are be used (as illustrated in the HSCA example 100 of FIG. 2E).

In the embodiment shown in FIGS. 3A and 3B, the RICPs, the photodetectors 132 in the active light sensing region 134 and the alignment features 136 are associated with two arrays of photodetectors (two array-sections) which have different pitches. In contrast, in RICPs in the active readout region and of the complementary alignment features are central and perimeter elements of an array of RICPs of equal size and pitch. To this end the inner section of the photodetector array (which includes the active photodetectors) has smaller photodetector sizes/pitch than the photodetectors 136 (being non-active/alignment photodetectors) in the outer array section. The inner array part/section containing the photodetectors 132, has a pitch which matches that of RICPs 112 at freezing temperature, but is smaller therefrom at the ambient/alignment temperature. Then, in the outer/perimeter part/section of the array, the photodetectors (being the alignment features 136), are positioned as a mirror image of their counterpart RICPs (complementary alignment features 116) and have the same pitch as the counterpart RICPs at the alignment temperature. It should be understood alternatively or additionally, in other/different embodiments of the invention, the arrangement of RICPs (active and alignment RICPs) in the second semiconductor structure 110 may be divided into two arrays of different pitches, while the photodetectors (active and alignment photodetectors) may be arranged in uniform pitch, in a single array or in an array which also has two sections with different pitches.

Figure 5A:
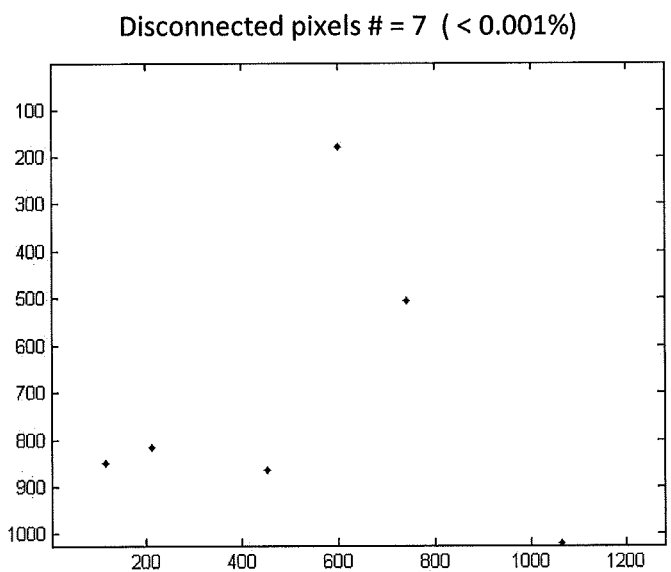
FIGS. 5A to 5C are self explanatory graphs exemplifying the distribution of defective/disconnected pixels (whose photodetection elements are disconnected from their respective RICPs in the ROIC) in FPAs having 1280×1024 pixels and configured as HSCA comprising GaSb based photodetection detection die coupled to Si based ROIC die.
Figure 5B:
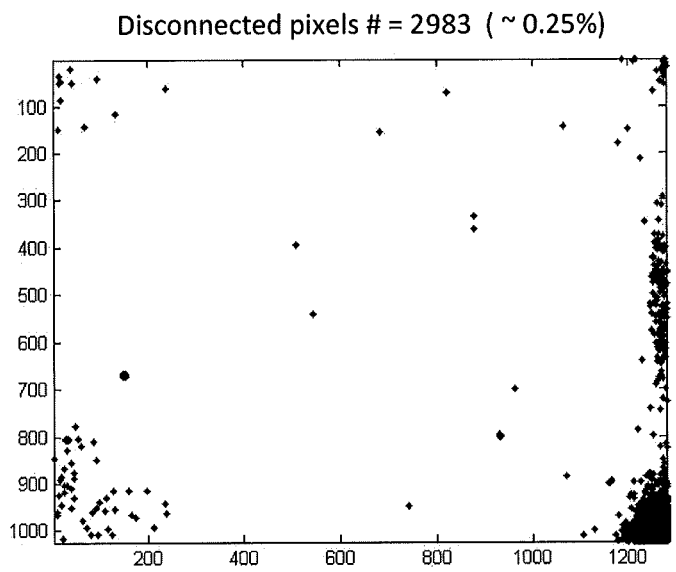
Figure 5C:
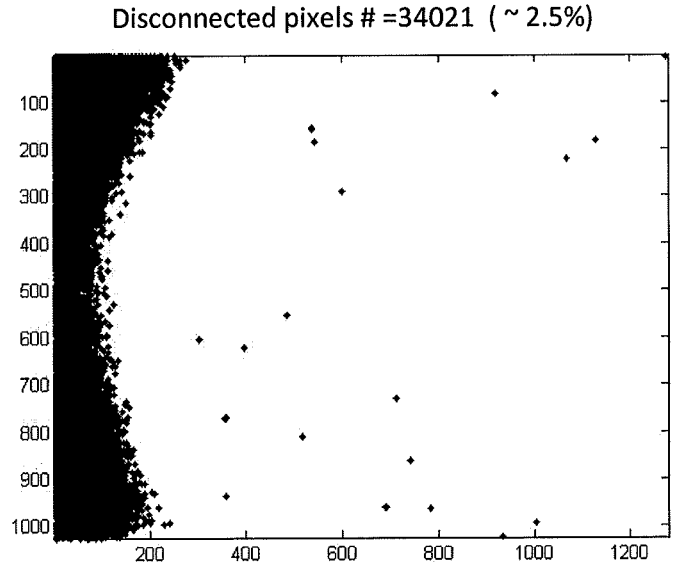

FIGS. 5A to 5C are self explanatory graphs exemplifying the distribution of disconnected pixels (whose photodetection elements are disconnected from their respective RICPs in the ROIC) in FPAs having 1280×1024 pixels and configured as HSCA comprising GaSb based photodetection die coupled to Si based ROIC die. The legend in the vertical and horizontal axes of the graphs span the lateral dimensions of the FPA, with 1280 pixels along the horizontal axis and 1024 pixels along the vertical axis. Disconnected pixels, which are defective due to electrical disconnection/mal-connection between its photodetective element and its respective RICP, are marked by dots in the graphs.

FIG. 5A exemplifies the number and distribution of disconnected pixels in the active region of an HSCA which was fabricated according to the technique of the present invention, as described above. In this case, the number of electrically disconnected active pixels in the active region is 7, namely less than 0.001% of the active pixels in the active region. Another important feature that is shown in the image is that the disconnected/defective pixels are somewhat randomly distributed within the active region (and not concentrated at particular region(s) of the device). This is an important advantage as it enables to easily compensate for missing information from the defective pixels, for example by interpolation using the information from its nearest neighbors.

FIGS. 5B and 5C exemplify the number and distribution of disconnected pixels in two HSCAs which were fabricated according to conventional techniques which utilize reflow to electrically connect between the photodetection and ROIC dies. These examples show that in conventional techniques, for the same size of the pixel array 1280×1024, the number of electrically disconnected pixels is relatively high (2,983 in FIG. 5B which is about 0.25% of the pixels; and more than 3,4000 defective pixels in FIG. 5C which is about 2.5% of the pixels in the array). This experiment exemplifies that in some embodiments the technique of the present invention reduce the numbers of disconnected pixels by two or even three orders of magnitude. Furthermore, as can be seen from FIGS. 5B and 5C, electrically disconnected pixels appear with higher probability near the edges of the pixel array. To this end, it is difficult to effectively compensate for the information missing from the defective pixels by using processing/algorithms such as interpolation. This is because the defective pixels are not randomly distributed but are concentrated at certain regions, in some of which there is only sparse distribution of operative pixels, making it practically impossible to obtain image data for these regions.

The invention claimed is:

1. A method for fabricating a photodetector-array, the method comprising:

providing a first semiconductor structure made according to a first semiconductor technology having a first coefficient of thermal expansion (CTE), the first semiconductor structure comprising: a first active region comprising an arrangement of a plurality of light sensitive regions associated with respective electric contacts and serving as active photodetectors of the photodetector-array, and a plurality of two or more alignment features located outside said first active region, and providing a second semiconductor structure made according to a second semiconductor technology having a second CTE different from the first CTE, the second semiconductor structure comprising: a second active readout region comprising an arrangement of a plurality of active readout integrated circuits pixels (RICPs) configured and operable for carrying out readout operations from said active photodetectors and having respective electric contacts for connecting to the electric contacts of said active photo detectors, and a plurality of two or more complementary alignment features located outside said second active readout region, wherein the first and second semiconductor structures are characterized by at least one of the following: the arrangement of the active photodetectors in said first semiconductor structure has a pitch different from a distance between said two or more alignment features; and the arrangement of the active RICPs in said second semiconductor structure has a pitch different than a distance between said two or more complementary alignment features; and wherein said pitch of the active photodetectors in said first semiconductor structure matches said pitch of the active RICPs in said second semiconductor structure at a certain relatively high temperature at which electrical coupling between the first and second semiconductor structures is performed, while the distance between the alignment features does not match the distance between the complementary alignment features at said relatively high temperature and the distance between the alignment features matches the distance between the complementary alignment features at a relatively low temperature being lower than said relatively high temperature;

aligning said first and second semiconductor structures at said relatively low temperature such that said two or more alignment features are substantially parallel and aligned with said two or more complementary alignment features; and carrying out electrical coupling between said electric contacts of the active photodetectors and said respective electric contacts of the RICP at said relatively high temperature such that the arrangement of the active photodetectors is substantially parallel and aligned with the arrangement of active readout circuits.

2. The method of claim 1 wherein said pitch distances of said electric contacts and the pitch distances of said respective electric contacts are selected such that at said high temperatures all the active photodetectors are respectively electrically coupled exclusively to their respective RICPs; and wherein said electrical coupling further comprises cooldown of said first and second semiconductor structures after said electrical coupling is performed while maintaining said exclusive electrical coupling between all said active photodetectors and respective RICPs thereof.

3. The method of claim 1 wherein at least one of the following:

(a) said electrical coupling is performed by heating said first and second semiconductor structures to said high temperature which is above a melting temperature of said electrical connection bumps for soldering electrical connection bumps between electrical contacts of said first and second semiconductor structures;

(b) said electrical coupling is includes a reflow process at which said first and second semiconductor structures are heated to said high temperature being in the order of 150° C. to 200° C.; and (c) said electrical coupling includes a non-reflow bonding process at which said first and second semiconductor structures are heated temperature below a melting temperature of said electrical connection bumps.

4. The method of claim 1 wherein said electrical coupling further includes cooling of first and second semiconductor structures to freezing temperature of said electrical connection bumps, and wherein pitches of said electric contacts of the active photodetectors and pitches of said respective electric contacts of the RICPs are arranged such that at said freezing temperature the electric contacts of the active photodetectors overlap with corresponding respective electric contacts of the RICPs.

5. The method of claim 1 wherein said pitch distances of said electric contacts of the active photodetectors and said pitch distances of said respective electric contacts of the RICPs substantially do not match at a temperature at which said aligning is performed.

6. The method of claim 1 wherein said alignment features and said complementary alignment features are arranged such that, at a certain alignment temperature at which said alignment is performed, which is substantially lower than said high temperature, displacements between pairs of said alignment features match displacements between respective pairs of said complementary alignment features thereby facilitating achieving accurate alignment between said first and second semiconductor structures during said aligning, by locating said first and second semiconductor structures such that the alignment features and the second alignment features are co-aligned.

7. The method of claim 6 wherein at least one of the following:

(a) said alignment temperature is in the range of 20-120° C.;

(b) said alignment temperature is in the range from about an ambient temperature and not exceeding freezing temperature of electrical connection bumps used to couple said first and second semiconductor structures;

(c) said alignment features include one or more alignment features arranged at a peripheral region surrounding said active photodetectors; and said complementary alignment features include one or more features similarly arranged at peripheral region outside a region of said active RICPs;

(d) said alignment features and said complementary alignment features include respective alignment marks made in the first and second semiconductor structures;

(e) said alignment features include a group of non-active photodetectors in the first semi-conductor structure; and (f) said alignment features include non-active photodetectors, which are electrically coupled to a Common contact of said second semiconductor structure during said electrical coupling.

8. The method of claim 1 comprising at least one of the following:

providing at least one of said first and second semiconductor structures in the form of a thin-film structure;

mechanically attaching at least one semiconductor structure of said first and second semiconductor structures to a stabilizing structure made of a material composition having different CTE than said at least one semiconductor structure; and placing bond materials between said first and second semiconductor structures;

thereby mechanically stabilizing said photodetector-array against stresses and/or strains formed between said first and second semiconductor structures at temperatures lower than said high temperature.

9. The method of claim 1 wherein said first semi-conductor structure comprises one of the following semiconductor materials: group III-V, group II-VI, group IV-VI, and group IV; and said second semi-conductor structure comprises silicon (Si) semiconductor material.

10. A photodetector-array, comprising:

a first semiconductor structure made according to a first semiconductor technology having a first coefficient of thermal expansion (CTE) and comprising an active region including a plurality of active photodetectors each comprising a light sensitive region of the first semiconductor structure and respective electric contacts;

a second semiconductor structure made according to a second semiconductor technology having a second CTE different than said first CTE and comprising an active readout region including a plurality of active readout integrated circuit pixels (RICPs) configured and operable for carrying out readout operations from said active photodetectors; said RICPs having respective electric contacts for connecting to the electric contacts of said active photodetectors;

wherein said first semiconductor and second semiconductor structures are assembled and bonded together such that the electric contacts of at least 99.5% of the active photodetector substantially overlap with the respective electric contacts of the RICPs associated therewith;

wherein said first semiconductor structure comprises two or more alignment features located outside said active region, and said second semiconductor structure comprises two or more complementary alignment features located outside said active readout region;

wherein the first and second semiconductor structures are characterized by at least one of the following: the arrangement of the active photodetectors in said first semiconductor structure has a pitch different from a distance between said two or more alignment features; and the arrangement of the active RICPs in said second semiconductor structure has a pitch different than a distance between said two or more complementary alignment features; and wherein said pitch of the active photodetectors in said first semiconductor structure matches said pitch of the active RICPs in said second semiconductor structure at a certain relatively high temperature at which electrical coupling between the first and second semiconductor structures is performed, while the distance between the alignment features does not match the distance between the complementary alignment features at said relatively high temperature and the distance between the alignment features matches the distance between the complementary alignment features at a relatively low temperature being lower than said relatively high temperature.

11. A photodetector-array fabricated according to the method of claim 1.

12. The photodetector-array of claim 11 comprising:

said first semiconductor structure being made according to said first semiconductor technology having said first coefficient of thermal expansion (CTE) and comprising the active region including the plurality of active photodetectors each comprising the light sensitive region of the first semiconductor structure and respective electric contacts;

said second semiconductor structure being made according to said second semiconductor technology having said second CTE different than said first CTE and comprising the plurality of active readout integrated circuit pixels (RICPs) configured and operable for carrying out readout operations from said active photodetectors; said RICPs having respective electric contacts for connecting to the electric contacts of said active photodetectors; and wherein said first semiconductor and second semiconductor structures are assembled and bonded together such that the electric contacts of at least 99.5% of the active photodetector substantially overlap with the respective electric contacts of the RICPs associated therewith.

13. The photodetector-array of claim 12 wherein an arrangement and pitch distances between the electric contacts of the active photodetectors in the active region match an arrangement and pitch distances between the electric contacts of the RICPs.

14. The photodetector-array of claim 12 wherein:

(a) the electric contacts of all the active photodetectors are aligned with, and properly electrically connected to electric contacts of respective RICPs; and (b) the electric contacts of the active photodetectors are electrically connected exclusively to the electric contacts of respective RICPs.

15. The photodetector-array of claim 12 wherein said first and second semiconductor structures are bonded to each other in flip chip bonding configuration and the electrical contacts of the active photodetectors are soldered to the electrical contacts of the RICPs with soldering bumps.

16. The photodetector-array of claim 12 wherein said first semiconductor structure comprises two or more alignment features located outside said active region, and said second semiconductor structure comprises two or more complementary alignment features with arrangement matching to said two or more alignment features; and wherein said first semiconductor and second semiconductor structures are assembled and bonded together such that pitch distances between at least some of said two or more alignment features are different than pitch distances between said corresponding ones of said two or more complementary alignment features.

17. The photodetector-array of claim 16 wherein said alignment features are configured according to at least one of the following:

(a) one or more of said alignment features are arranged at a peripheral region surrounding said active region;

(b) said alignment features and said complementary alignment features include respective alignment marks and complementary alignment marks made in the first and second semiconductor structures;

(c) said alignment features include non-active photodetectors in the first semi-conductor structure located outside said active region; and (d) at least some of said alignment features and complementary alignment features are overlapping contact pads in the first and second semiconductor structures and are respectively electrically connected to thereby provide Common contact between said first and second semiconductor structures.

18. The photodetector-array of claim 12 comprising at least one of the following to mechanically stabilize said photodetector-array against stresses and/or strains formed due to differences in the CTEs of said first and second semiconductor structures:

at least one of said first and second semiconductor structures in the form of a thin film structure;

a stabilizing structure attached to at least one of the semiconductor structures and having different CTE than the CTE of the one semiconductor structure; and bond materials placed between said first and second semiconductor structures.

19. The photodetector-array of claim 12 wherein at least one of the following:

(a) said first semi-conductor structure comprises one of the following semiconductor materials: group III-V, group II-VI, group IV-VI, and group IV; and said second semiconductor structure comprises silicon (Si) semiconductor material; and (b) said array of active photodetectors include more than 1280×1024 active photodetectors arranged with a pitch of 10 microns, and more preferably include about 1920×1536 active photodetectors with a pitch of 10 microns.

* * * * *